United States Patent
Ozawa et al.

[11] Patent Number: 5,361,963
[45] Date of Patent: Nov. 8, 1994

[54] DISPENSER

[75] Inventors: Kazushige Ozawa; Hiromune Tanaka, both of Shizuoka, Japan

[73] Assignee: Tenryu Technics Co., Ltd., Shizuoka, Japan

[21] Appl. No.: 126,320

[22] Filed: Sep. 24, 1993

[30] Foreign Application Priority Data

Sep. 25, 1992 [JP] Japan .................. 4-255125

[51] Int. Cl.⁵ .................. B05C 5/00; H05K 3/34
[52] U.S. Cl. .................. 228/33; 228/8; 228/56.5; 228/248.1; 228/41; 222/420; 222/325; 118/256
[58] Field of Search .......... 228/41, 33, 8, 56.5, 228/102, 248.1; 118/256, 696, 700; 222/325, 420, 309, 386; 427/96

[56] References Cited

U.S. PATENT DOCUMENTS

| | | | |
|---|---|---|---|
| 4,046,290 | 9/1977 | Louder | 222/267 |
| 4,572,103 | 2/1986 | Engel | 118/697 |
| 4,942,984 | 7/1990 | Miller | 222/334 |
| 4,967,933 | 11/1990 | Maiorca et al. | 118/698 |
| 4,983,103 | 1/1991 | Ogawa | 222/148 |
| 5,052,338 | 10/1991 | Maiorca et al. | 118/668 |

FOREIGN PATENT DOCUMENTS 2152593 10/1991 United Kingdom .

*Primary Examiner*—Samuel M. Heinrich

[57] ABSTRACT

A dispenser for applying creamy solder onto a substrate, comprising: a syringe 1 storing therein creamy solder; a needle 2 fixed at the forward end of this syringe 1; and a driving mechanism 3 using a pulse-controlled stepping motor and an eccentrically rotating drive motion. The driving mechanism 3 comprises: a linear guide 10 for guiding a syringe holder which holds the syringe 1, a stepping motor 11, a crank 13 and a connecting rod 14 rotatably supported on the crank and the syringe holder. When, the stepping motor 11 is rotated by a predetermined angle, the crank 13 and the connecting rod 14 are eccentrically rotated in an interlocking relation to the rotation of this stepping motor, and the syringe 1 is upwardly and downwardly moved within a predetermined range through a syringe holder 9.

9 Claims, 6 Drawing Sheets

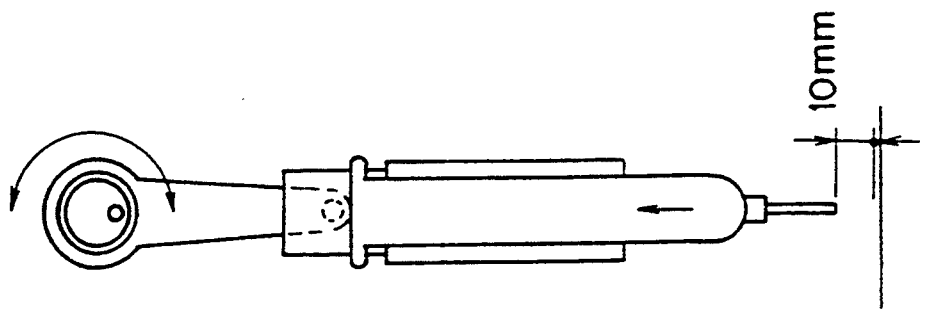
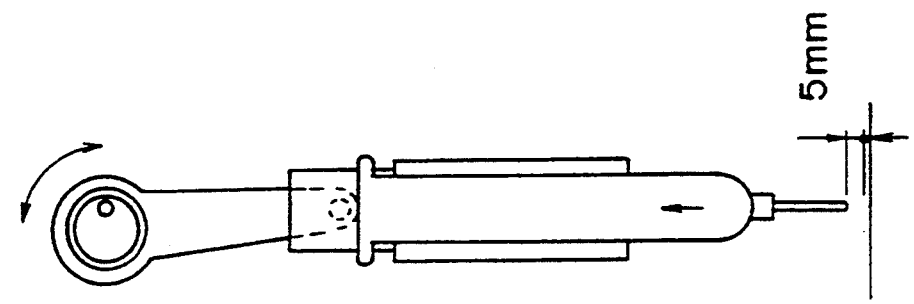
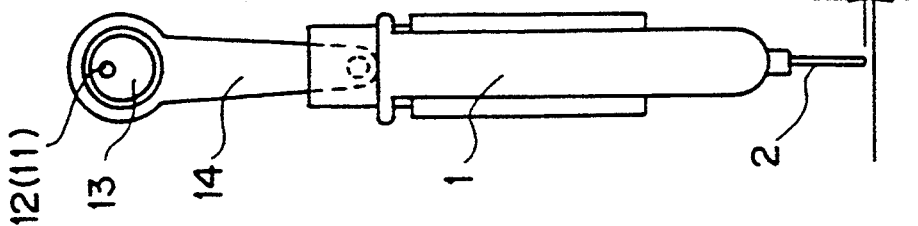

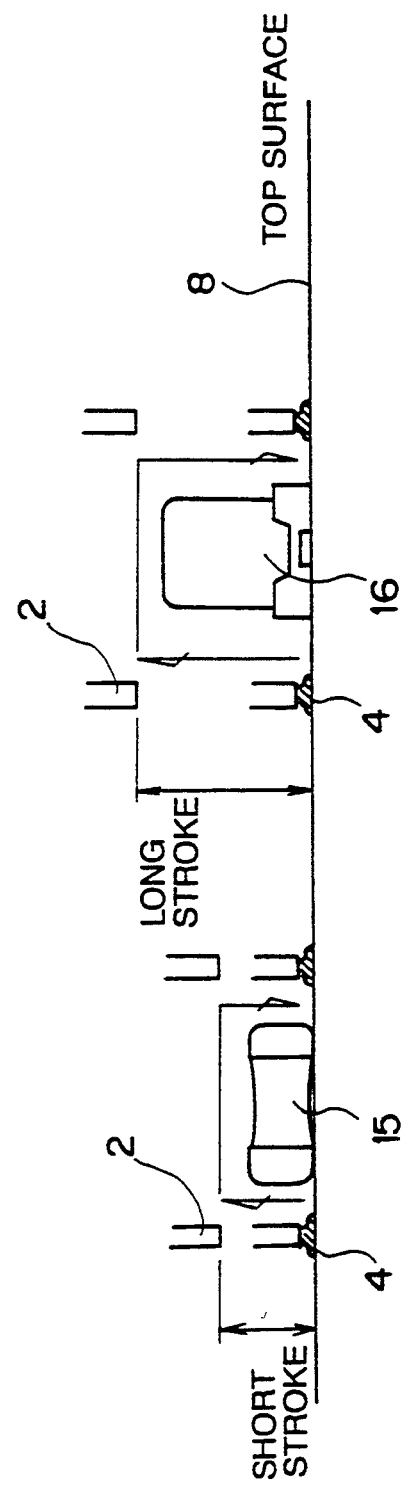

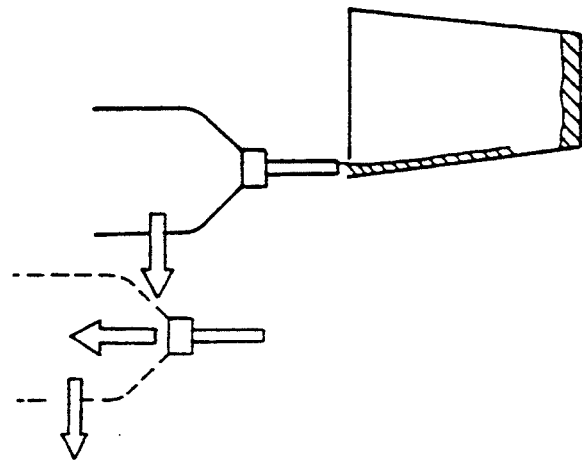
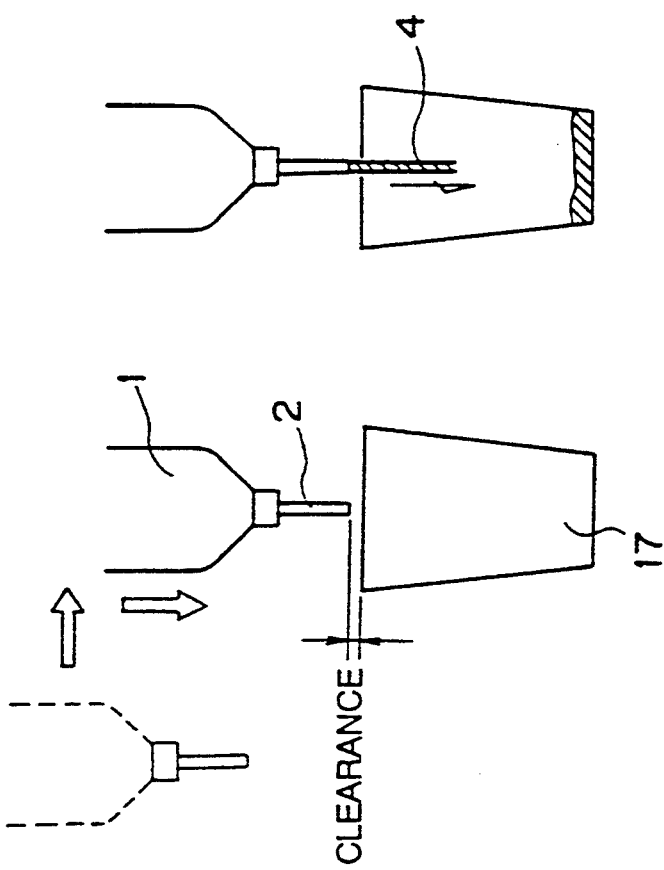

DISPENSER

BACKGROUND OF THE INVENTION

1. Field of the Invention

This invention relates to a dispenser and more particularly to a technique effectively applicable to a dispenser which applies a material such as creamy solder and an adhesive onto an article such as a substrate used in a semiconductor technique, wherein a vertically moving stroke of a needle of the dispenser is controlled with high precision and conditions for discharging the material to be applied are controllable in accordance with remaining amount of the material.

2. Related Art Statement

In an automatic assembly line used in producing semiconductors for example, such an arrangement is adopted that, when electronic parts such as a chip resistor, a capacitor and a packaged IC are mounted onto a substrate formed thereon with a circuit pattern, creamy solder is applied on predetermined positions of the substrate by use of a dispenser or the like, and then, electronic parts are automatically mounted using a chip mounter and the like.

The dispenser used in such an assembly line comprises a needle having a predetermined inner diameter and fixed at the forward end of the dispenser, a syringe for storing therein creamy solder, and a plunger housed in the syringe in an upwardly and downwardly movable manner for discharging the creamy solder by a displacement of the plunger toward the needle. The creamy solder is pushed out of the plunger due to this displacement of the plunger and discharged from the forward end of the needle.

As a driving mechanism of this dispenser, a hydraulic equipment such as an air cylinder has been used, and suction and exhaust of fluidal pressure into and out of the air cylinder cause a piston rod to move up and down, whereby a syringe fixed to the piston rod is moved up and down within a predetermined range.

In the above-described conventional technique, since the vertical movement of the syringe is controlled by suction and exhaust of the fluidal pressure into and out of the air cylinder, quick responsiveness is not obtained when the fluidal pressure is supplied to or exhausted from a fluid chamber of the air cylinder to cause displacement of the piston rod for making the syringe move up and down.

Further, it is impossible to obtain a satisfactory clearance precision between the forward end of the needle and the substrate in the stroke range of the upward and downward movements of the syringe, even if high degree of positioning precision is required for applying solder.

Furthermore, in the automatic assembly line, it is necessary to detect the decrease of the material to be applied, to replenish the material or to exchange an old syringe for new one filled with the material, before the material in the syringe is used up. In this management of the material to be applied, such a method, for example, is adopted that detection is made with the naked eye of an operator or by estimating the used amount based on the time elapsed and the scheduled amount of using the material.

However, in the above-described management by the detection method with the naked eye of the operator or the detection method of time-based estimation, considerable labor of the operator is required and inferior products tend to be produced due to uncertainty of detection.

SUMMARY OF THE INVENTION

Therefore, it is an object of the present invention to provide a dispenser wherein a pulse-controlled stepping motor is used in a driving mechanism of the dispenser and the stroke of the up-and-down movement of the syringe is controlled by a crank mechanism so that the responsiveness of the driving mechanism is improved and the forward end of the needle can be positioned with high precision.

Furthermore, it is another object of the present invention to provide a dispenser wherein the level of the remaining material to be applied is easily and reliably detected by a plurality of detecting means, so that the discharging conditions can be controlled in accordance with the detected level.

The above-described and other objects and the novel features of the present invention will become apparent more fully from the following description of the specification in conjunction with the accompanying drawings.

The typical invention out of ones disclosed herein is outlined as follows.

That is, a dispenser according to the present invention is one wherein a needle formed to have a predetermined inner diameter is provided at the forward end of a syringe containing therein a material to be applied, and the material is applied from the forward end of the needle onto an article at a position where the material is placed. The dispenser comprises, as a driving mechanism: a linear guide for guiding up-and-down movements of a syringe holder which holds the syringe; a stepping motor which rotates by a predetermined angle in response to a pulse signal from the outside; a crank eccentrically fixed to a rotary shaft of the stepping motor; and a connecting rod rotatably supported at one end thereof on the syringe holder and at the other end thereof on the crank.

The signal for driving the stepping motor may be controlled to obtain desired movements of the dispenser.

Furthermore, the dispenser may further comprises: a plunger housed in the syringe in a manner capable of up-and-down movements, for pushing out and discharging the material to be applied due to the displacement of the plunger toward the needle; a means to be detected, which is incorporated in the plunger; and a detecting means provided at the outside of the syringe for detecting the means to be detected.

In this case, a plurality of the detecting means may be arranged along the axial direction of the syringe.

In the above-described dispenser according to the present invention, due to the provision of the linear guide, stepping motor, crank and connecting rod as the driving mechanism of the dispenser, the stepping motor is rotated by the predetermined angle, the crank and the connecting rod are eccentrically rotated in an interlocking relation to the rotation of the stepping motor, and the syringe is moved upwardly or downwardly by a predetermined distance via the syringe holder.

When the stepping motor is pulse-controlled, a position of the forward end of the needle with respect to the article to which the material is applied can be controlled to predetermined lengths of stroke such for example as a short stroke and a long stroke in accordance with heights of parts mounted on a substrate for example, so that the material such as creamy solder or adhesive can be applied within a predetermined stroke range suitable for the material and the article.

With this arrangement, the use of the pulse-controlled stepping motor can improve the responsiveness of the driving mechanism, and can control the up-and-down stroke of the syringe through the crank mechanism and the resolution (in terms of smallest controllable length of movement) in the displacement of the forward end of the needle can be improved so that the forward end of the needle can be positioned with high precision.

Furthermore, the plunger incorporating therein the means to be detected is housed in the syringe and the detecting means are provided at the outside of the syringe, so that the changes in the level of the material remaining in the syringe can be detected through the detection of the means to be detected by the detecting means.

In this case, the plurality of detecting means such for example as Hall sensors may be arranged along the axial line of the syringe, whereby a magnet or the like as being the means to be detected in the plunger is detected by the plurality of detecting means, so that the level of the remaining material is easily and quickly detected and the conditions for discharging the material such as discharge pressure and discharge time length can be controlled in accordance with the detected level of the remaining material.

With this arrangement, the level of the remaining material to be applied is easily and reliably detected, so that the most suitable discharging conditions can be obtained in accordance with the level of the material.

BRIEF DESCRIPTION OF THE DRAWINGS

FIGS. 3(a)-3(c) are explanatory views showing the stroke of the up-and-down movement of the dispenser in this embodiment;

FIG. 4 is an explanatory view showing the up-and-down movement and lateral movement of the needle on an article to which the material in the dispenser is applied in this embodiment;

FIGS. 6(a)-6(c) are explanatory views showing a waste discharging operation of the material in this embodiment.

DETAILED DESCRIPTION OF THE PREFERRED EMBODIMENT

Figure 1A:
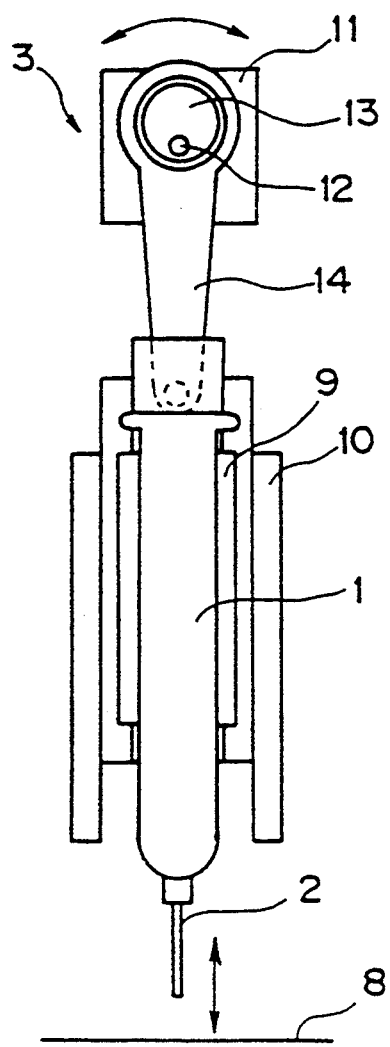
FIGS. 1(a) and 1(b) are a front view and a side view showing the dispenser according to the present invention, respectively.
Figure 1B:
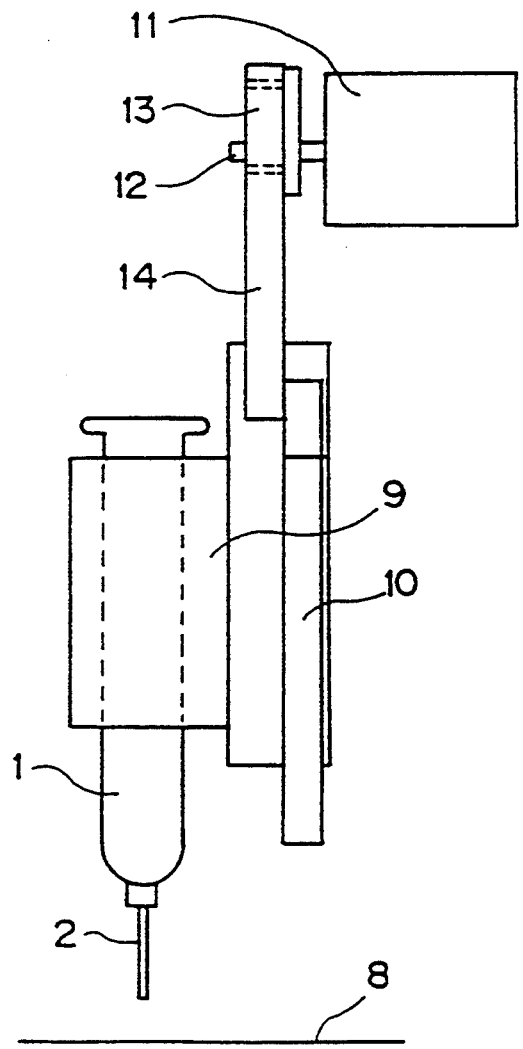

Firstly, referring to FIGS. 1(a) and 1(b), arrangement of an embodiment of the dispenser according to the invention will be explained.

The dispenser in this embodiment is one used, for example, in semiconductor technique for applying a material onto an article (substrate) 8, and comprises: a syringe 1 storing therein creamy solder as a material to be applied; a needle 2 fixed to the forward end of the syringe 1; and a driving mechanism 3 including a pulse-controlled stepping motor and a crank mechanism drived by eccentric rotation, etc.

Figure 2:
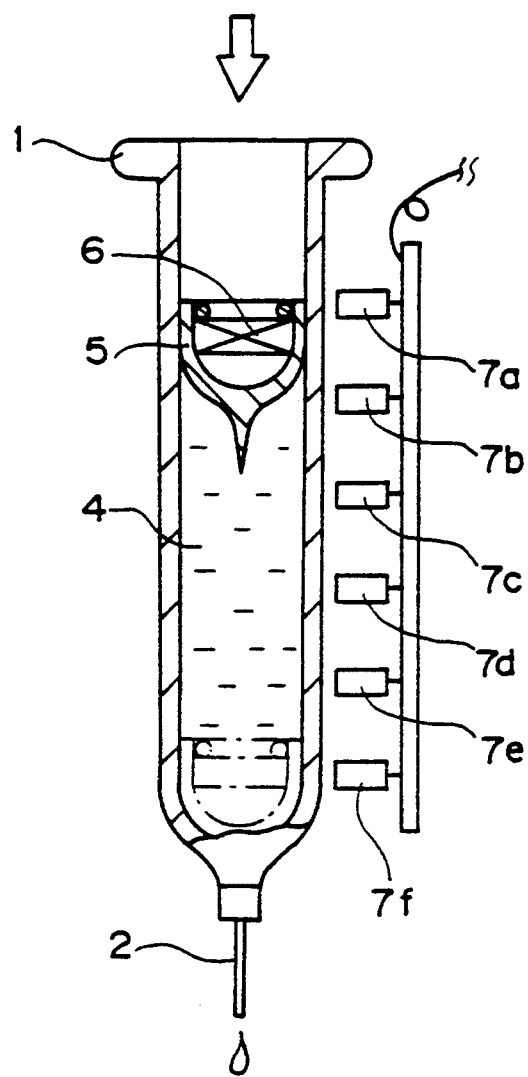
FIG. 2 is a sectional view showing the interior of the dispenser in this embodiment.

As shown in FIG. 2, a plunger 5 for discharging creamy solder 4 due to the displacement thereof toward the needle 2 is housed in the syringe 1 in an upwardly and downwardly movable manner, and a magnet (means to be detected) 6 is incorporated in the plunger 5. The creamy solder 4 stored in the syringe 1 and air pressure introduced from the outside are separated from each other by the plunger 5 and the plunger 5 is displaced by a predetermined distance toward the needle 2 due to the introduction of the air pressure, whereby a predetermined amount of the creamy solder 4 is pushed out and discharged from the forward end of the needle 2.

Furthermore, six Hall sensors (detecting means) 7a-7f consisting of Hall elements, for detecting the magnetic force of the magnet 6 are arranged along the axial direction of the syringe 1 at the outside of the syringe 1, and the displacement of the plunger 5 is detected by the Hall sensor at the position corresponding to the displacement of the magnet 6. Then, the discharging conditions such as the discharge pressure and discharge time length for the creamy solder 4 can be controlled in accordance with the level of the creamy solder 4 remaining in the syringe 1 detected from the conditions of the Hall sensors 7a-7f. Further, when the plunger 5 is lowered to a position indicated by one-dot chain lines in FIG. 2, the Hall sensor 7f at the lowest level detects that the creamy solder 4 is decreased to a prescribed amount, whereby an operator replenishes creamy solder 4 into the syringe or exchanges the old syringe 1 for new one.

The needle 2 is formed to have a predetermined inner diameter in accordance with the article 8 to which the material in the syringe 1 is applied, the material to be applied and the like. A needle 2 having the most suitable size is exchangeably fixed to the forward end of the syringe 1. The creamy solder 4 can be discharged from the forward end of the needle 2 in many patterns such for example as one-point drip, multi-points, a straight line and a circumference. These discharge patterns can be formed by up-and-down movements of the syringe 1 by the driving mechanism 3, and parallel and/or rotary movements of the substrate 8 by a driving mechanism (not shown). Discharge amount can be adjusted by selecting discharge time length, air pressure, a size of the needle 2 and the like.

The driving mechanism 3 comprises: a syringe holder 9 holding the syringe 1; a linear guide 10 for guiding a syringe holder 9 in a manner allowing up-and-down movements of the syringe holder 9; a stepping motor 11 which rotates by a predetermined angle in response to a pulse signal from the outside; a crank 13 eccentrically fixed to a rotary shaft 12 of the stepping motor 11; and a connecting rod 14 rotatably supported at one end thereof on the syringe holder 9 and rotatably supported at the other end thereof on the crank 13. With this arrangement, when the stepping motor 11 is rotated by the predetermined angle, and the crank 13 and the connecting rod 14 are eccentrically rotated in an interlocking relation to the rotation of this stepping motor 11, the syringe 1 is moved upwardly and downwardly within the predetermined range through the syringe holder 9.

Operations of this embodiment will hereunder be described.

At first, the up-and-down movements in the dispenser by the driving mechanism 3 will be explained in conjunction with FIGS. 3(a)-3(c).

Firstly, the stepping motor 11 is rotated by the predetermined angle from a state shown in FIG. 3(a), i.e., one where the rotary shaft 12 of the stepping motor 11 is positioned upwardly of the crank 13, and the forward end of the needle 2 of the syringe 1 is located at the bottom position with the forward end of the needle 2 having a predetermined clearance from the substrate 8.

Further, the crank 13 and the connecting rod 14 are eccentrically rotated in an interlocking relation to the rotation of this stepping motor 11. Then, the syringe 1 is vertically moved within a predetermined range through the syringe holder 9.

For example, when the stepping motor 11 is rotated through 90° in the clockwise direction as shown in FIG. 3(b), the rotary shaft 12 of the stepping motor 11 is positioned rightwardly of the crank 13, and the forward end of the needle 2 of the syringe 1 is raised from the substrate 8 by a short stroke, for example, of 5 mm in addition to the clearance of the predetermined length.

As shown in FIG. 4, when, for example, an electronic part 15 having a small height such as a chip resistor is mounted on the substrate 8, the forward end of the needle 2 is raised by the distance of the short stroke, thereafter, moves laterally to clear the electronic part 15, and, then, the stepping motor 11 is rotated by 90° in the counterclockwise direction to return to the former position, with the forward end of the needle 2 being lowered to a predetermined position to apply the creamy solder 4.

On the other hand, when the stepping motor 11 is rotated by 180° in the clockwise direction as shown in FIG. 3(c), the rotary shaft 12 of the stepping motor 11 is positioned downwardly of the crank 13, and the forward end of the needle 2 of the syringe 1 is raised from the substrate 8 by a long stroke of, for example, 10 mm, twice that of the short stroke, in addition to the predetermined length of clearance.

As shown in FIG. 4, even when an electronic part 16 having a large height such as an electrolytic capacitor is mounted on the substrate 8, the forward end of the needle 2 is raised by the distance of the long stroke being twice that of the short stroke, and move laterally clearing the electronic part 16, and thereafter, the stepping motor 11 is rotated by 180° in the counterclockwise direction, thereby the forward end of the needle 2 being lowered to the predetermined position to apply the creamy solder 4.

Figure 5:
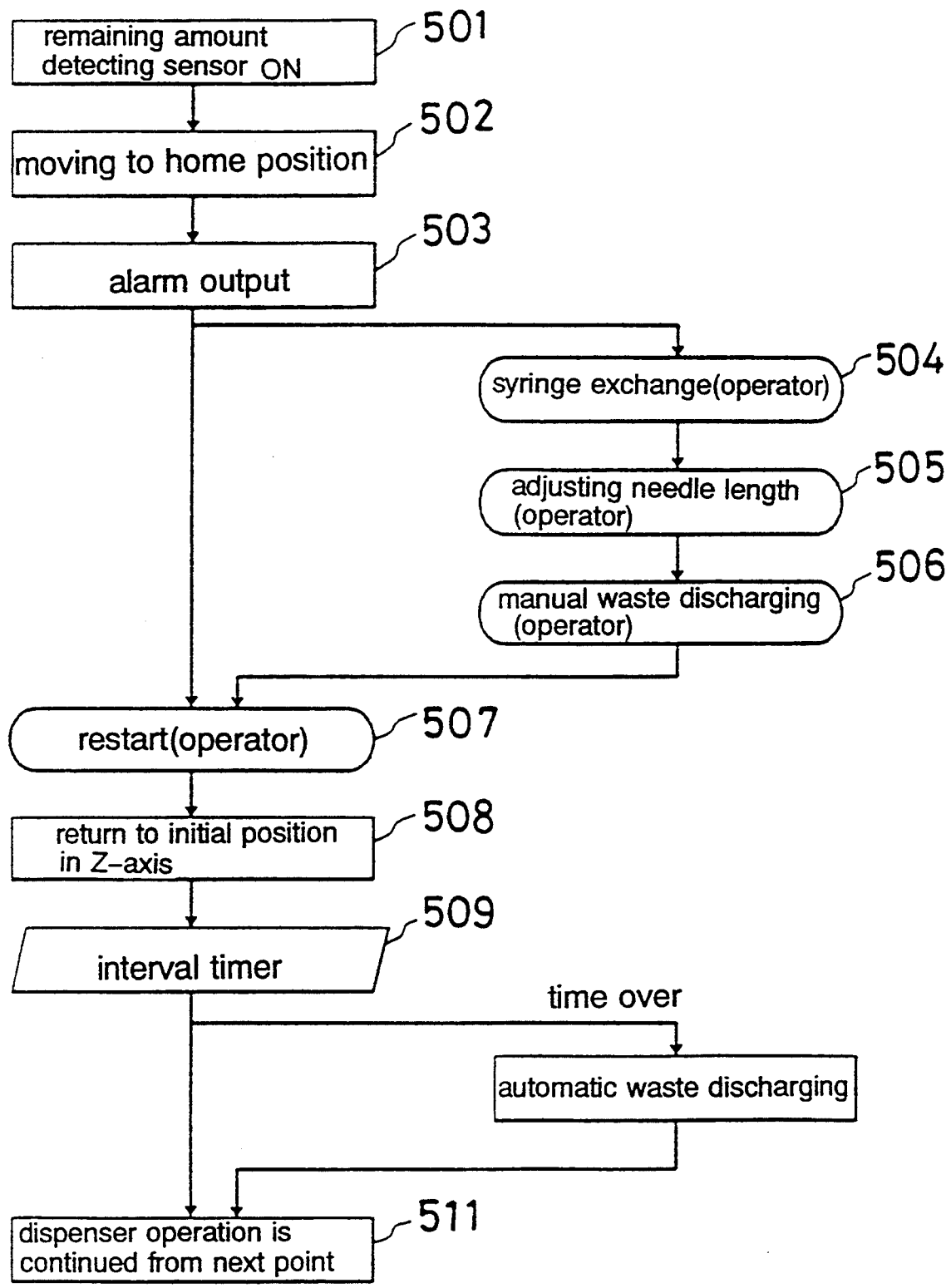
FIG. 5 is a flow chart showing a sequence of detecting the remaining amount of the material to be applied in this embodiment.

Next, sensing of the level of the remaining creamy solder 4 and the steps therefor are described in conjunction with FIG. 5.

When air pressure is introduced from the outside into the syringe 1, the plunger 5 displaces toward the needle 2 by a predetermined distance, and a predetermined amount of the creamy solder 4 is pushed out and discharged from the forward end of the needle 2 to a predetermined position on the substrate 8. Thus, as the creamy solder 4 is successively applied, the creamy solder 4 in the syringe 1 is decreased, and the plunger 5 is displaced downwardly along the axial direction in the syringe 1 toward the forward end of the syringe 1.

The positions of the displacement of the magnet 6 in the plunger 5 are detected by the Hall sensors 7a–7f provided at the outside of the syringe 1. That is, changes in the level of the remaining creamy solder 4 in the syringe 1 are successively sensed by the respective Hall sensors 7a–7f, starting from the Hall sensor 7a at the top position in FIG. 2 and until the Hall sensor 7f at the lowest position in FIG. 2, so that the change in the level of the remaining solder 4 can be easily and highly accurately detected at each level of the remaining solder 4.

Then, the discharging conditions such as the discharge pressure and the discharge time length of the creamy solder 4 can be controlled in accordance with those levels of the remaining solder 4. For example, a number of combinations of the discharge pressure and the discharge time length may be previously determined, so that a suitable combination of the discharge pressure and the discharge time can be easily selected from the predetermined set of combinations in accordance with the remaining level of the creamy solder 4 and in accordance with each discharge point on the substrate.

Further, when the plunger 5 is lowered to the position indicated by the one-dot chain lines in FIG. 2, it is detected by the Hall sensor 7f at the bottom level that the creamy solder 4 is decreased to the prescribed amount, and then, the dispenser is moved to its home position (stand-by position) and an alarm output is given to the operator (Steps 501–503).

Then, the creamy solder 4 is replenished into the syringe 1, or the old syringe 1 is exchanged for new one. When, for example, the operator exchanges the old syringe 1 for new one storing therein the creamy solder 4, thereafter, the length of the needle 2 is adjusted to the correct value, and further, waste discharging is manually performed before the start of the applying operation (Steps 504–506).

This waste discharging operation is performed manually by the operator according to the procedure shown in FIGS. 6(a)–6(c).

Firstly, as shown in FIG. 6(a), the syringe 1 is moved from the stand-by position where the exchange has been made to the position above a container 17 for waste discharging is installed, and then, the forward end of the needle 2 is lowered to a clearance level of a predetermined distance from an edge of the container 17.

Then, as shown in FIG. 6(b), the creamy solder 4 is discharged into the container 17 by a predetermined amount or for some predetermined time counted by a timer.

Further, as shown in FIG. 6(c), the syringe 1 is moved laterally, the creamy solder 4 suspended at the forward end of the needle 2 is cut away by the edge of the container 17, then, the syringe 1 is raised, and thereafter, moved to the stand-by position, thus completing the waste discharging operation.

When the waste discharging operation is completed as described above, the operation to apply the material is restarted by the operator, making the dispenser return up to the initial position in Z-axis (i.e., in the vertical direction). While applying operation is performed, time intervals between operations being supervised by an interval timer. (Steps 507–509).

When the time interval, i.e. the time during which the dispenser is paused, reached the predetermined length set by the operator, the waste discharging operation is automatically performed according to the procedure similar to the above-described mannual waste discharging operation (Step 510). When the automatic waste discharging operation is completed, the dispenser is moved to a next discharge point, thus continuing the applying operation (Step 511).

As described above, in the dispenser of this embodiment, the stepping motor 11 rotatable by the predetermined angle in response to the pulse signal is used in the driving mechanism 3 for the dispenser, whereby a position of the forward end of the needle 2 with respect to the substrate 8 is controlled to the predetermined lengths of stroke, and the stroke operation can be realized with high responsiveness as compared with the conventional control by an air cylinder.

Further, rotation of the stepping motor 11 is transformed to eccentrical rotation through the crank 13, whereby the resolution of the movement of the syringe is improved as compared with the displacement of the mere vertical movements by an air cylinder, so that the high clearance precision between the substrate 8 and the forward end of the needle 2 and the high positioning precision according to the discharge points can be obtained.

Furthermore, the magnet 6 is incorporated in the plunger 5 housed in the syringe 1, and the six Hall sensors 7a-7f are arranged along the axial direction of the syringe 1 at the outside thereof, so that the changes in the level of the creamy solder 4 remaining in the syringe 1 can be easily detected.

Further, the discharging conditions can be controlled in accordance with the level of the remaining creamy solder 4, and the detection made by the Hall sensor 7f disposed at the lowest position can made the operator recognize necessity of the replenishment of the creamy solder 4 or of the exchange of the old syringe 1 with new one.

As described above, the invention by the present inventors has been explained in detail in conjunction with the embodiment, however, the present invention should not be limited to the above embodiment and can be variously modified within the scope of the invention.

For example, in this embodiment, the dispenser for applying the creamy solder 4 onto the substrate has been described. The present invention, however, should not be limited to the above embodiment, and, as an material to be applied, the present invention can be widely applicable to materials such as adhesives, conductive pastes and the like, and as an article to which the material in the syringe is applied, various articles can be thought of in association with the materials to be applied.

Furthermore, in the above-described embodiment, the magnet 6 is incorporated in the plunger and the magnetic force of the magnet 6 is sensed by the Hall sensors 7a-7f. It, however, is possible to form a plunger of resinous material containing magnetic powder, thus making the plunger itself magnetic.

Further, in place of the Hall sensors 7a-7f, the magnetic force can be detected by other magnetically inductive type sensors such as a magnetoresistance element, and number of the sensors used can be variously changed, without limiting to six.

Furthermore, the angle of rotation of the stepping motor 11 can be selected in accordance with the length of the up-and-down stroke of the forward end of the needle 2 with respect to the substrate 8, and further, the length of the stroke can be controlled also by changing the diameter of the crank 13 to make the eccentric rotation large or small.

Hereinabove, description has been given mainly of the case where the present invention is applied to the semiconductor technique and particularly to the dispenser for applying the creamy solder 4. The present invention, however, should not be limited to this, and is widely applicable to the dispensers used in other fields of technique for applying or supplying materials such as lubricant, chemical agents, foods and paints.

Out of the inventions disclosed herein, the effects obtained by the typical ones will be briefly described as follows.

(1) As a driving mechanism, the dispenser includes a linear guide for upwardly and downwardly guiding a syringe holder holding a syringe; a stepping motor rotatable by a predetermined angle in response to a pulse signal from the outside; a crank eccentrically fixed to the rotary shaft of the stepping motor; and a connecting rod rotatably supported at one end thereof on the syringe holder and at the other end thereof on the crank; whereby the crank and the connecting rod are eccentrically rotated in the interlocking relation to the stepping motor rotatable by the predetermined angle to thereby able to move the syringe upwardly and downwardly within the predetermined range, so that the resolution of displacement at the forward end of the needle can be improved particularly by the eccentric rotation by the crank mechanism, thus enabling to achieve highly precise positioning.

(2) The pulse signals for driving the stepping motor can be controlled so that the position of the forward end of the needle with respect to the article to which the material is applied is controlled to predetermined lengths of stroke, and the material can be applied within the predetermined range of stroke. Also, responsiveness in the movements of this operation can be improved by using the stepping motor.

(3) The dispenser comprises: the plunger housed in the syringe in an upwardly and downwardly movable manner for pushing out and discharging the material to be applied by the displacement of the plunger toward the needle; the article to be detected, which is incorporated in the plunger; and the detecting means provided at the outside of the syringe, for detecting the article to be detected, and, particularly, a plurality of detecting means are arranged along the axial direction of the syringe. Therefore, the changes in the level of the material remaining in the syringe can be detected through the detection of the means to be detected by the plurality of detecting means, so that the level of the remaining material can be easily and reliably sensed, and it becomes possible to set the suitable discharging conditions in accordance with the level of the remaining material detected by the plurality of detecting means.

(4) Because of the above-described items (1)-(3), a dispenser can be suitably applied to the case where a material such as creamy solder and an adhesive is applied onto an article such as substrate particularly in the semiconductor technique and the like, the up-and-down down stroke of the needle can be controlled with high precision, and the discharging conditions can be controlled in accordance with the level of the remaining material.

What is claimed is:

1. A dispenser for applying a material onto an article comprising:
 a syringe containing the material to be applied;
 a needle formed to have a predetermined inner diameter and provided at a forward end of the syringe, the material being applied from a forward end of the needle onto the article, and
 a driving mechanism which comprises:
 a linear guide for upwardly and downwardly guiding a syringe holder holding said syringe;

a stepping motor rotatable by a predetermined angle in response to a pulse signal from outside;

a crank eccentrically fixed to a rotary shaft of the stepping motor; and a connecting rod rotatably supported at one end thereof on said syringe holder and rotatably supported at the other end thereof on said crank, said crank and said connecting rod being eccentrically rotated in an interlocking relation to rotation of the stepping motor when the motor is rotated, and thereby said syringe being upwardly and downwardly moved within a predetermined range through said connecting rod and said syringe holder.

2. A dispenser as set forth in claim 1, wherein:

the pulse signal for driving the stepping motor is controlled and thereby a position of the forward end of the needle with respect to said article to which the material is applied is controlled to a predetermined length of stroke.

3. A dispenser as set forth in claim 1, wherein:

said dispenser comprises:

a plunger housed in said syringe in an upwardly and downwardly movable manner, for pushing out and discharging said material by a displacement of the plunger toward said needle;

an article to be detected, which is incorporated in the plunger; and detecting means provided outside of said syringe, for detecting the means to be detected; and changes in a level of the material remaining in the syringe are detected through detection of said means to be detected by said detecting means.

4. A dispenser as set forth in claim 1, wherein a plurality of said detecting means are arranged along an axial direction of said syringe, and discharging conditions of said material are controlled in accordance with states of detection by the plurality of detecting means.

5. A dispenser as set forth in claim 3, wherein said means to be detected is formed of a magnetic means incorporated in said plunger, and said detecting means are formed of magnetically inductive type sensors for detecting said magnetic means.

6. A dispenser as set forth in claim 5, wherein said detecting means comprise Hall elements.

7. A dispenser as set forth in claim 4, wherein, when said plunger is lowered to a position detected by a lowest detecting means among the plurality of detecting means, an alarm output is given.

8. A dispenser as set forth in claim 1, wherein said article to which the material is applied is a substrate mounted thereon with an electronic part, and the material is creamy solder.

9. A dispenser as set forth in claim 8, wherein, when said stepping motor is rotated by a first predetermined angle, a bottom end of the needle of said syringe is raised to a first position higher than an electronic part mounted on said substrate and having a first height, and, when said stepping motor is rotated by a second predetermined angle different from the first predetermined angle, the bottom end of the needle of said syringe is moved to a second position higher than an electronic part having a second height different from the first height.

* * * * *